(12) United States Patent
Yang et al.

(10) Patent No.: US 6,859,393 B1
(45) Date of Patent: Feb. 22, 2005

(54) GROUND STRUCTURE FOR PAGE READ AND PAGE WRITE FOR FLASH MEMORY

(75) Inventors: Tien-Chun Yang, San Jose, CA (US); Shigekazu Yamada, Cupertino, CA (US); Ming-Huei Shieh, Cupertino, CA (US); Pau-Ling Chen, Saratoga, CA (US)

(73) Assignee: FASL, LLC, Sunnyvale, CA (US)

( * ) Notice: Subject to any disclaimer, the term of this patent is extended or adjusted under 35 U.S.C. 154(b) by 218 days.

(21) Appl. No.: 10/264,387

(22) Filed: Oct. 4, 2002

(51) Int. Cl.$^7$ .............................................. G11C 16/04

(52) U.S. Cl. .............................. 365/185.14; 365/185.11

(58) Field of Search ...................... 365/185.14, 185.11, 365/185.23, 185.13

(56) References Cited

U.S. PATENT DOCUMENTS 6,134,144 A * 10/2000 Lin et al. ............... 365/185.14

* cited by examiner

Primary Examiner—Anh Phung

(57) ABSTRACT

A ground structure for page read and page write for flash memory. An array structure of flash memory cells comprises a plurality of sectors. Each sector comprises I/O blocks plus reference arrays and an array of redundant cells. Each I/O block comprises sub I/O blocks. Each sub I/O block within an I/O block, as well as other structures including reference cells, redundant cells and edge structures is coupled to a unique ground reference signal. These unique ground reference signals may be selectively coupled to a system ground or a biased ground reference. This novel ground arrangement enables a page read operation in which one bit from each sub I/O block can be read simultaneously. In addition, one bit from each I/O block may be programmed simultaneously. Further, the ground reference voltage for cells of the array may be selectively adjusted to optimize operation.

8 Claims, 10 Drawing Sheets

GROUND STRUCTURE FOR PAGE READ AND PAGE WRITE FOR FLASH MEMORY

TECHNICAL FIELD

Embodiments of the present invention relate to design and operation of flash memory devices. More particularly, embodiments of the present invention provide a ground structure for page read and page write for flash memory.

BACKGROUND ART

Flash memory is a type of semiconductor computer memory with many desirable characteristics. Like read only memory, ROM, it is non-volatile, meaning that the contents of the memory are stable and retained without applied electrical power.

A major advantage of flash over ROM is that the memory contents of flash may be changed after the device is manufactured. Flash memory has found wide acceptance in many types of computers, including desktop computers, mobile phones and hand held computers. Flash memory is also widely used in digital cameras and portable digital music players, for example "MP3" players.

In addition to direct flash storage applications, for example in video cameras, flash-based storage devices are replacing rotating magnetic disks, sometimes known as hard drives, in many applications. Compared to hard drives, flash is significantly more rugged, quieter, lower power, and for some densities such a flash based device may be smaller than a comparable hard drive.

Silicon nitride based flash memory has many advantages as compared to its floating gate and tunneling oxide based counterparts. Silicon-Oxide-Nitride-Oxide-Silicon (SONOS) is potentially very dense in terms of number of cells per unit area that can be used and it requires fewer process steps as compared to floating gate memory. Moreover, it can be easily integrated with standard SRAM process technology. A further advantage of using SONOS devices is their suitability for applications requiring large temperature variations and radiation hardening.

FIG. 1 shows a Silicon-oxide-nitride-oxide-silicon (SONOS) memory cell 10 as has been well known in the conventional art. The SONOS stack is a gate dielectric stack and consists of a single layer of polysilicon, a triple stack ONO (Oxide-Nitride-Oxide) gate dielectric layer and a MOS channel. The ONO structure may consist of a tunnel oxide 12a with thickness between 16 and 22 angstroms, a nitride memory storage layer 12b of equivalent electrical oxide thickness of 100 angstroms and a blocking oxide layer 12c approximately 40 angstroms thick.

The technology may consist of a double diffused well process with deep N-well for the memory array, which may contain a P well. The double diffused well allows the SONOS to be integrated into a P-type substrate CMOS process. It may have a single level of poly and the memory transistor uses an ONO stack for gate dielectric.

By appropriate design, the roles of N channel 20 and N channel 25 may be reversed. More specifically, at some times N channel 20 may function as a source for cell 10, and at other times N channel may function as a drain for cell 10. Likewise, N channel 25 may at times function as a drain, and at other times function as a source. Consequently, it is possible to store charge in nitride memory storage layer 12b in physical proximity to both N channel 20 and N channel 25. For example, charge 20a is "near" N channel 20, and charge 25a is "near" N channel 25.

It is further possible to minimize the interaction between change 20a and charge 25a, such that they are effectively independent, and may represent separate bits of stored non-volatile information. In this manner, a single SONOS memory cell 10 may actually store two bits of information. A second bit stored in a single cell in this manner is identified by AMD Corporation of Santa Clara, Calif. as a "Mirror Bit™".

Using technologies such as SONOS and Mirror Bit™, very dense arrays of flash memory have been produced and marketed. Typically large flash memory semiconductors are divided into a hierarchy of regions, for example for control and redundancy purposes. For example, a flash memory device may have a fundamental word size of 16 bits. Words may be grouped into four-word groups called pages. Pages may be further grouped into sectors composed of 8k (k=1024) pages, or 32k words. The entire device may comprise, for example, 128 sectors.

In order to increase the density (number of cells per unit area) of a flash device, in the prior art there is typically only a single common array ground path for each sector. Portions of a cell, e.g., the source or drain, must be electrically connected ("switched") to ground for common operations, for example reading and programming the cell. Unfortunately, the prior art use of a single ground per sector limits all cells of each sector to one type of operation. More particularly, individual pages (a portion of a sector) can not be written or read independently of full sector operations. Consequently, read and write operations must be performed at a sector level, which can be a very slow process, especially if a relatively small amount of data is to be read or written. Accordingly, it is highly desirable to impart page read and page write capabilities to high density mirror bit flash memory.

DISCLOSURE OF THE INVENTION

A ground structure for page read and page write for flash memory is disclosed. An array structure of flash memory cells comprises a plurality of sectors. Each sector comprises I/O blocks plus reference arrays and an array of redundant cells. Each I/O block comprises sub I/O blocks. Each sub I/O block within an I/O block, as well as other structures including reference cells redundant cells and edge structures is coupled to a unique ground reference signal. These unique ground reference signals may be selectively coupled to a system ground or a biased ground reference. This novel ground arrangement enables a page read operation in which one bit from each sub I/O block can be read simultaneously. In addition, one bit from each I/O block may be programmed simultaneously. Further, the ground reference voltage for cells of the array may be selectively adjusted to optimize operation.

BEST MODE FOR CARRYING OUT THE INVENTION

In the following detailed description of the present invention, ground structure for page read and page write for flash memory, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail so as not to unnecessarily obscure aspects of the present invention.

Ground Structure for Page Read and Page Write for Flash Memory

Embodiments of the present invention are described in the context of design and operation of flash memory devices. However, it is appreciated that embodiments of the present invention may be utilized in other areas of electronic design and operation.

Figure 1:
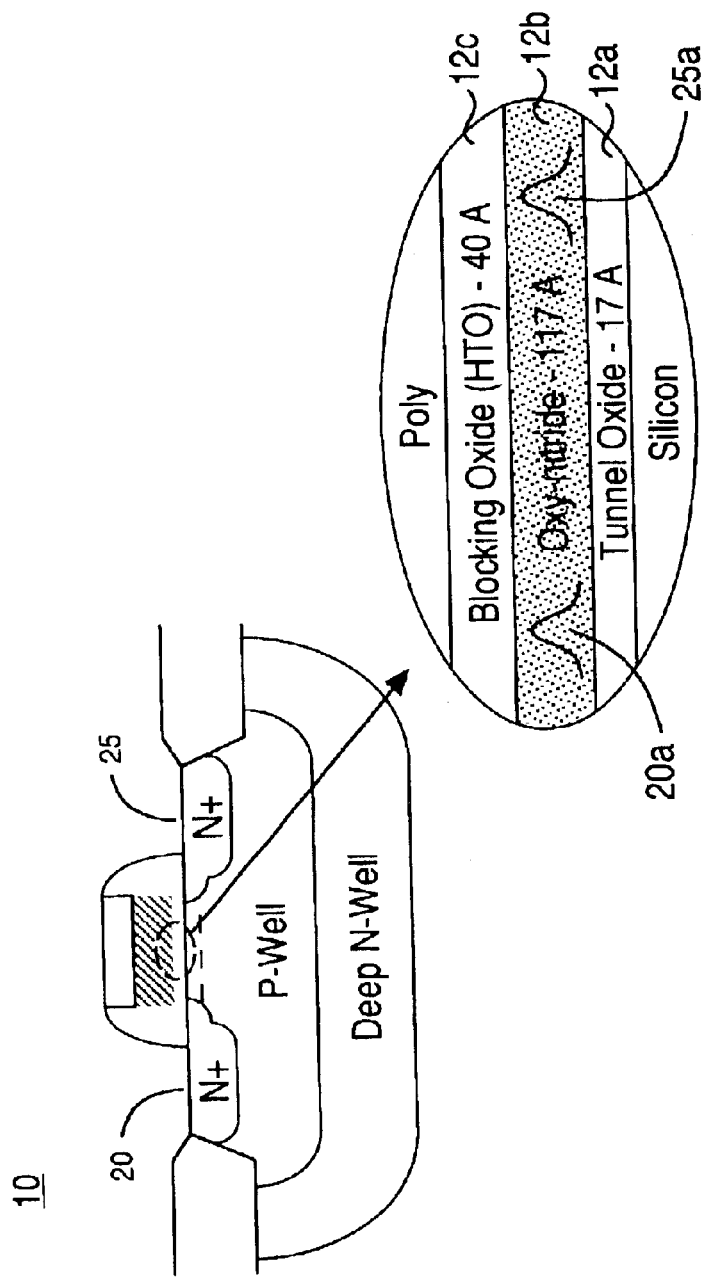
FIG. 1 shows a Silicon-Oxide-Nitride-Oxide-Silicon (SONOS) memory cell as has been well known in the conventional art.
Figure 2A:
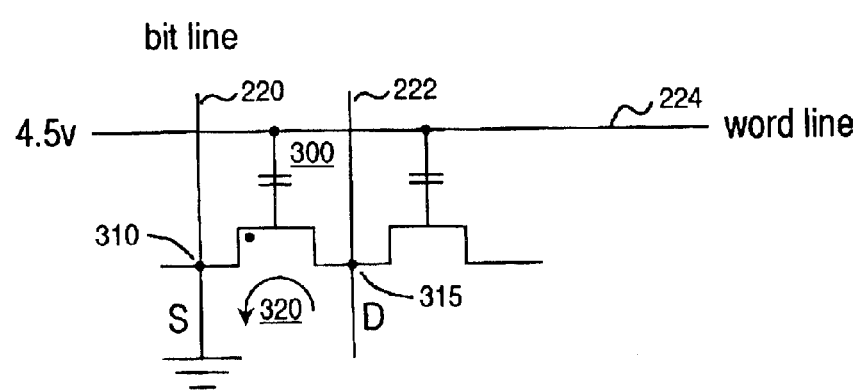
FIGS. 2A and 2B illustrate reading bits of a flash memory cell, according to an embodiment of the present invention.

FIG. 2A illustrates reading a bit stored in the "left" portion of a SONOS cell 300, according to an embodiment of the present invention. SONOS cell 300 is connected to word line 224, and bit lines 220 and 222. It is appreciated that word lines are generally depicted as horizontal and bit lines as vertical. However, the roles and orientations of the interconnections may be exchanged. To read a bit stored in the "left" portion of SONOS cell 300, word line 224 is brought to a read voltage of about 4.5 volts. Bit line 220 is grounded. Node 310 functions as a source for the cell, and current 320 flows from node 315, acting as a drain, to node 310 through bit line 220 to ground. Sensing logic connected to bit line 222 can interpret the magnitude of current 320 to determine if a bit is stored in the "left" portion of SONOS cell 300.

Figure 2B:
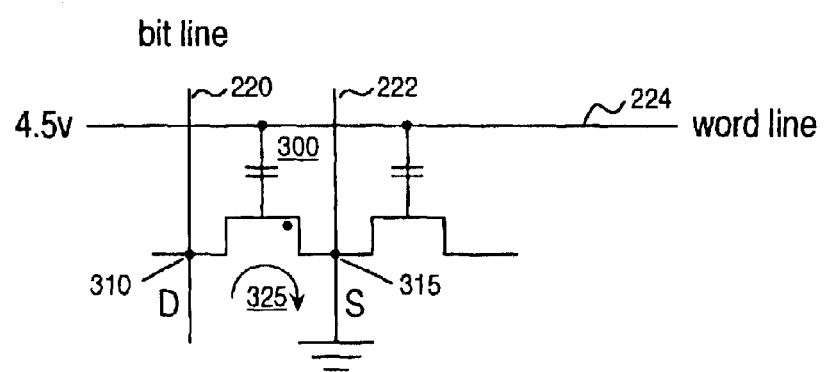

FIG. 2B illustrates reading a bit stored in the "right" portion of SONOS cell 300, according to an embodiment of the present invention. Word line 224 is brought to read a voltage of approximately 4.5 volts. Bit line 222 is grounded and functions as a source for cell 300. Bit line 220 functions as a drain. Current 325 flows from drain to source, and is sensed by logic connected to bit line 220.

Figure 2C:
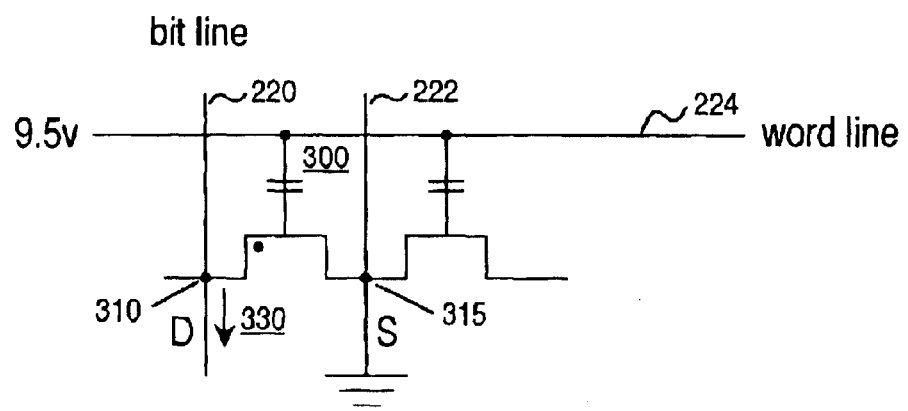
FIGS. 2C and 2D illustrate writing or programming bits of a flash memory cell, according to an embodiment of the present invention.

FIG. 2C illustrates writing a bit to the "left" portion of SONOS cell 300, according to an embodiment of the present invention. Word line 224 is brought to a programming voltage of about 9.5 volts. Bit line 222 is grounded and acts as a source. Current 330 is sourced from word line 224 through node 310 into bit line 220. Current 330 causes hot carrier injection of charge into the nitride layer of the SONOS stack in physical proximity to node 310.

Figure 2D:
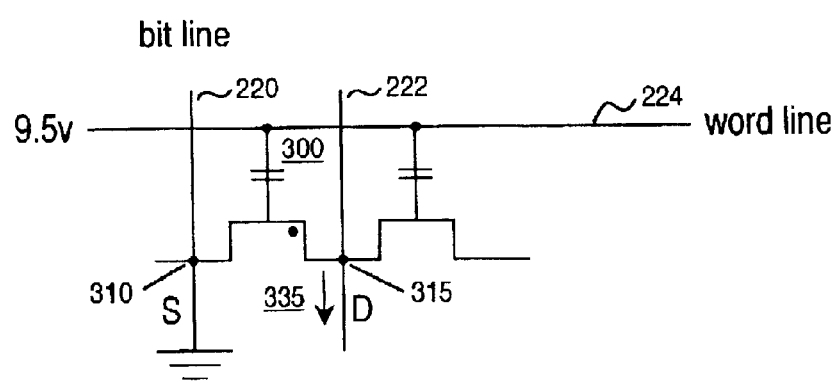

FIG. 2D illustrates writing a bit to the "right" portion of SONOS cell 300, according to an embodiment of the present invention. Word line 224 is brought to a programming voltage of about 9.5 volts. Bit line 220 is grounded and acts as a source. Current 335 is sourced from word line 224 through node 315 into bit line 222. Current 335 causes hot carrier injection of charge into the nitride layer of the SONOS stack in physical proximity to node 310.

Figure 3:
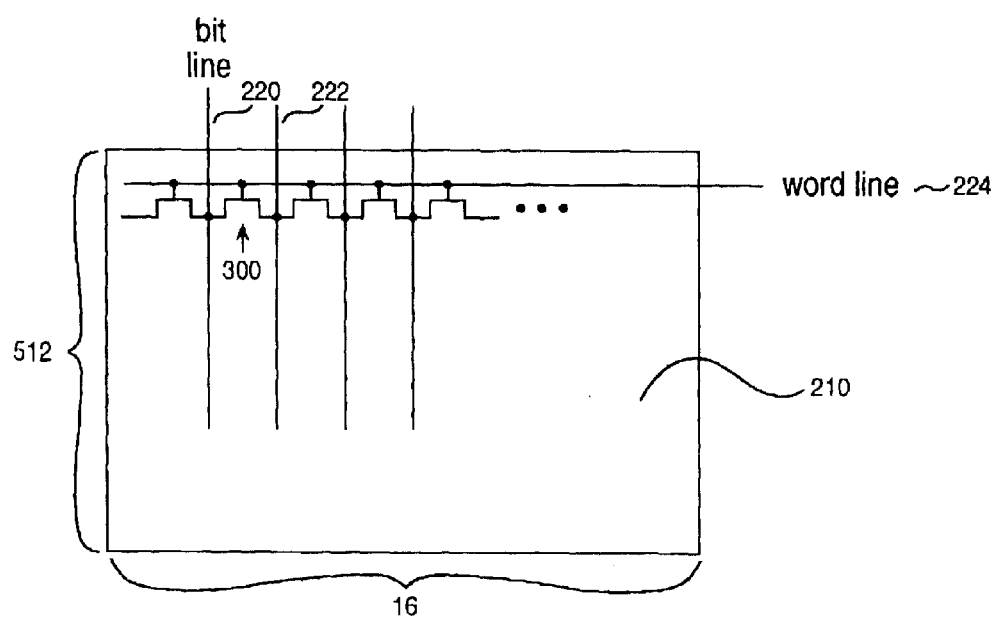
FIG. 3 illustrates a grouping of individual instances of a cell, according to an embodiment of the present invention.

FIG. 3 illustrates a grouping of individual instances of cell 300, according to an embodiment of the present invention. A "word" is formed from a row of 16 cells. It is appreciated that a word structure on the interior of an array of flash memory cells may not correspond to a word grouping of bits externally. For example, a word presented as 16 parallel bits at the pins of a flash memory device may not be stored in adjacent cells within sub I/O block 210.

A word is controlled by a word line, for example word line 224. Individual bits may be accessed though the individual bit lines, for example bit lines 220 and 222. A "sub I/O block" 210 is formed of 512 "rows" of words. Consequently, sub I/O block 210 comprises 512 words, or 8k cells.

Figure 4:
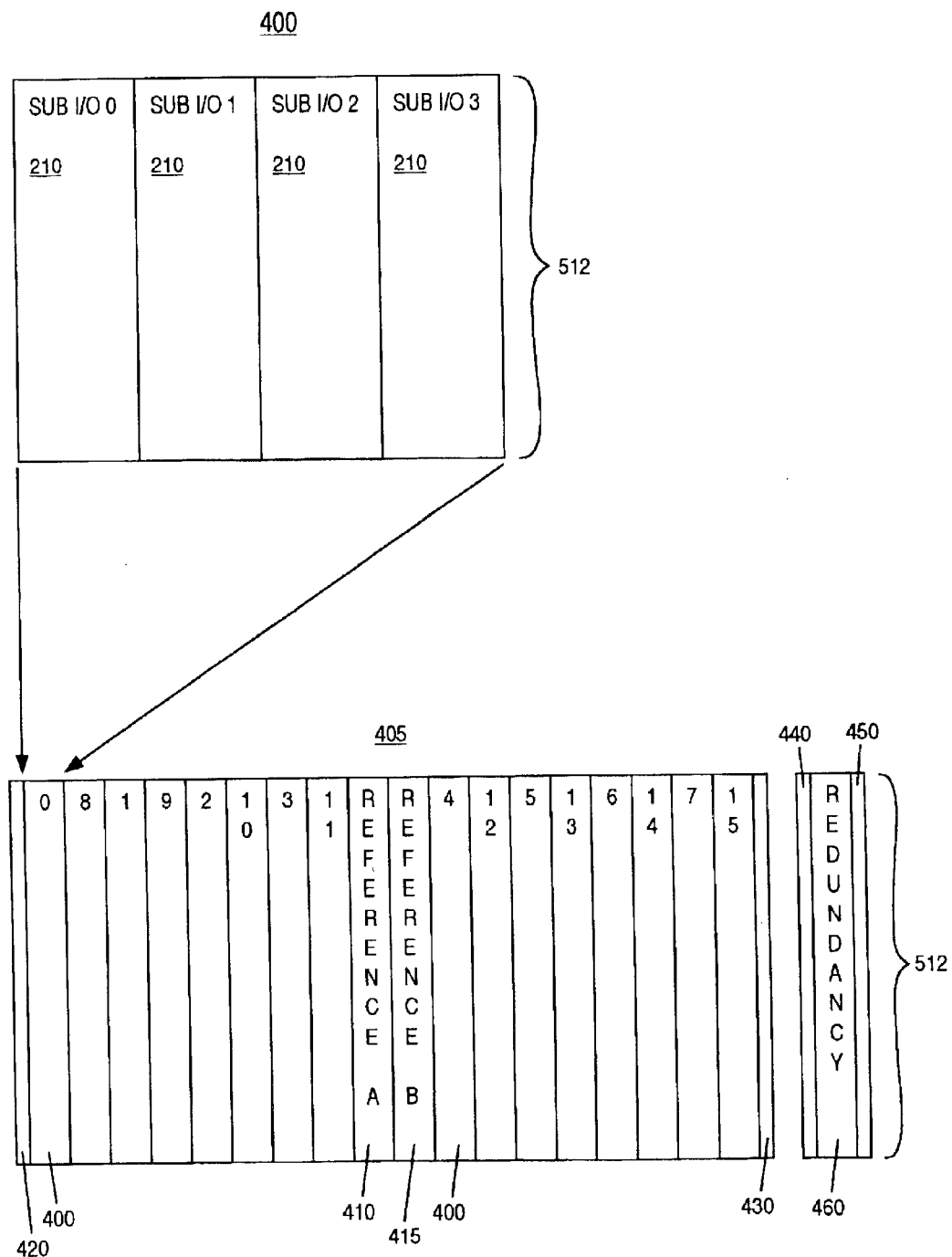
FIG. 4 illustrates a grouping of 4 instances of a sub I/O block combined to form an I/O block, according to an embodiment of the present invention.

FIG. 4 illustrates a grouping of 4 instances of sub I/O block 210 combined to form an I/O block 400, according to an embodiment of the present invention. I/O block 400 comprises 512 rows of 4 words, or 64 bits. Consequently, I/O block 400 comprises 2k words, or 32k cells. The word lines of each sub I/O block are connected, such that a word line of I/O block 400 connects to 64 cells.

Still referring to FIG. 4, a "sector" 405 is comprised of 16 instances of I/O block 400 which act as the main storage elements, a "redundancy" I/O block 460, which may logically replace portions of one of the primary I/O blocks in case of defects in the primary I/O block, and two sub I/O blocks of reference cells, reference A 410 and reference B 415. Sector 405 further comprises array edge structure 420 on the left of the array, array edge structure 430 on the right of the array, redundancy edge structures 440 and 450 on the left and right respectively of the redundancy I/O block 460. Edge structures 410, 430, 440 and 460 comprise about five cells each that are generally not used for normal functioning of the device. Due to lithography and other processing influences, such edge cells typically have a very high defect rate (e.g., they are too long, too short or too thin) and are generally not reliable. The edge cells separate functional cells from the edge processing effects such that the functional cells typically do not suffer such ill effects. The I/O blocks are interleaved, such that consecutively numbered I/O blocks are separated by an intervening I/O block. For example. I/O block 1 is separated from I/O block 2 by I/O block 9.

Figure 5:
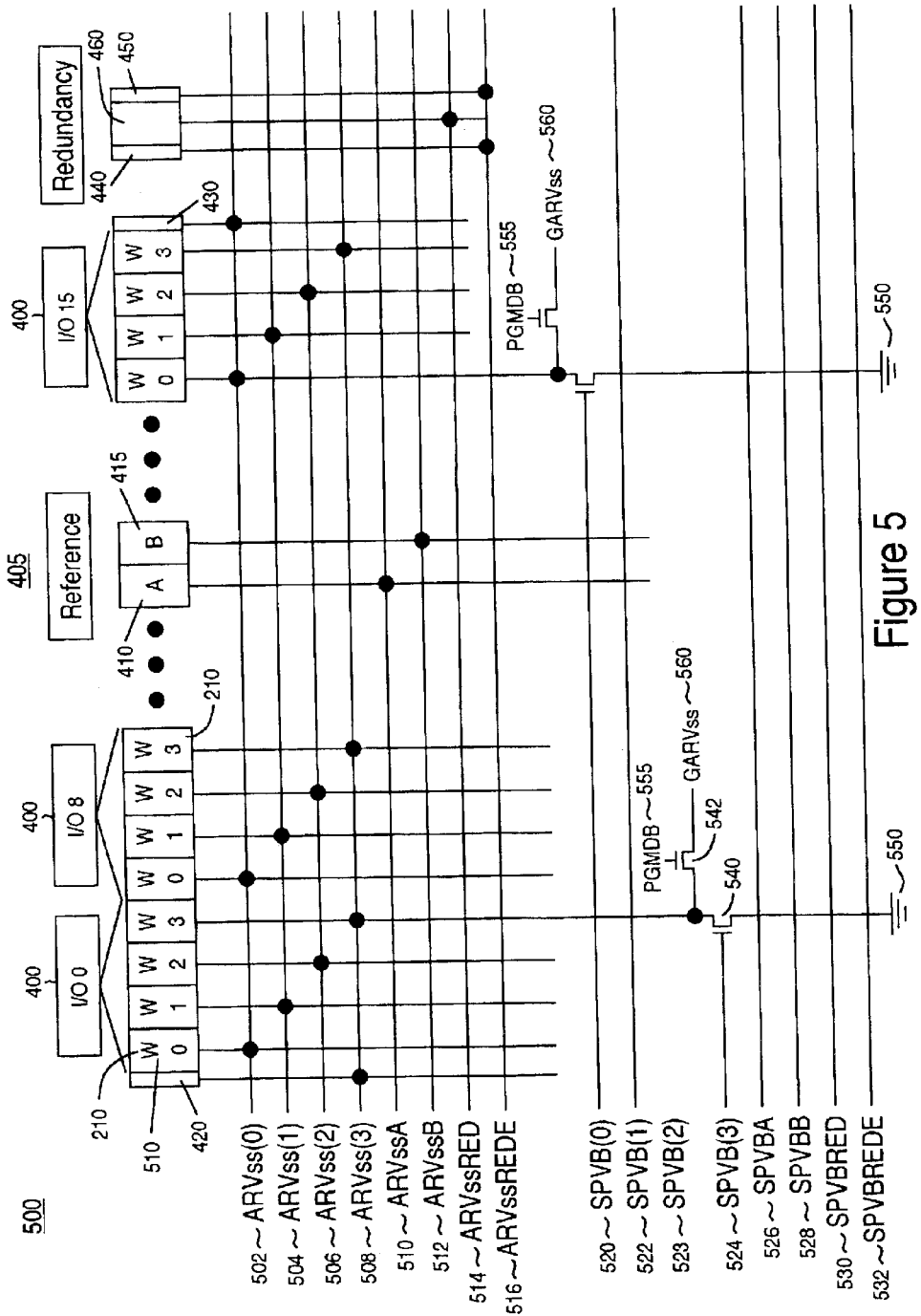
FIG. 5 illustrates a grounding arrangement of a sector comprising an array of flash cells, according to an embodiment of the present invention.

FIG. 5 illustrates a grounding arrangement 500 of a sector 405 comprising an array of flash cells, according to an embodiment of the present invention. Grounding arrangement 500 enables page read and page write operations, in order to increase the rate at which a device comprising such a grounding arrangement is able to store and access data. Increased data operation rates generally confer a competitive advantage, and are highly desirable.

"Array ground" signal ARVss(0) 502 is coupled to the "word 0" sub I/O blocks, for example I/O block 0 word 0 block 510. ARVss(0) is likewise coupled to all word 0 sub I/O blocks of the sector. As a sector comprises 16 I/O blocks, each with sub I/O blocks numbered 0–3, ARVss(0) is consequently coupled to 16 word 0 sub I/O blocks. In a similar manner, array ground signal ARVss(1) 504 is coupled to the word 1 sub I/O blocks of the sector; array ground signal ARVss(2) 506 is coupled to the word 2 sub I/O blocks of the sector and array ground signal ARVss(3) 508 is coupled to the word 3 sub I/O blocks of the sector.

The reference cells are assigned dedicated grounding signals to improve their noise characteristics. Array ground signal ARVssA 510 is coupled to reference A, and array ground signal ARVssB 512 is coupled to reference B. Left edge structure 420 is coupled to ARVss(3) 508 so as to maximize its ground separation from adjacent word 0 sub I/O. Similarly, right edge structure 430 is coupled to ARVss (0) 502 so as to maximize its ground separation from adjacent word 3 sub I/O.

Since the redundant sub I/O may be employed as a substitute for any of the 64 other sub I/Os within a sector, it is provided dedicated grounding signals to minimize grounding interactions with potential adjacent sub I/Os. Redundancy 460 is coupled to a dedicated grounding signal ARVssRED 514. Redundancy edge structures 440 and 450 are coupled to a dedicated ground signal ARVssREDE 516.

The sub I/O grounding signals described above are further coupled to a main device ground 550 through a pass device, for example device 540 controlled by a control signal, for example SPVB(3) 524. Main device ground 550 has a very low impedance path to the device ground connection. Each word sub I/O ground is coupled to ground 550 in a similar manner. More particularly, each sub I/O block 0 is coupled through pass devices controlled by SPVB(0) 520 to main device ground 550. Each sub I/O block 1 is coupled through pass devices controlled by SPVB(1) 522 to main device ground 550. Each sub I/O block 2 is coupled through pass devices controlled by SPVB(2) 523 to main device ground 550. Each sub I/O block 3 is coupled through pass devices controlled by SPVB(3) 524 to main device ground 550. Likewise, reference A 410 is coupled through a pass device controlled by SPVBA 526 to main device ground 550 and reference B 415 is coupled through a pass device controlled by SPVBB 528 to main device ground 550. Left edge structure 420 is coupled through a pass device controlled by SPVB(3) 524 to main device ground 550 and right edge structure 430 is coupled through a pass device controlled by SPVB(0) 520 to main device ground 550. In a similar manner, the redundant sub I/O block 460 is coupled through a pass device controlled by SPVBRED 530 to main device ground 550. Redundancy edge structures 440 and 450 are coupled through pass devices controlled by SPVBREDE 532 to main device ground 550.

Referring once again to FIGS. 2A and 2B, it is necessary to "ground" a bit line, for example bit line 220, to read the contents of a memory cell. More specifically, a bit line is selectively connected to a ground signal through a series of switching devices (not shown). It is appreciated that a wide variety of configurations of selection logic is well suited to embodiments of the present invention.

To read from a sector of flash cells, the "SP" signals (SPVB(0), SPVB(1), SPVB(2), SPVB(3), SPVBA, SPVBB, SPVBRED (e.g., if the redundant sub I/O block is needed) and SPVBREDE) as shown in FIG. 5 are made active, which couples a bit line (selected via other selection logic, not shown) in each sub I/O to ground 550. Further, the PGMDB 555 signal is made inactive, in order not to couple global array ground signal 560 to ground 550. For example, PGMDB 555 controls pass device 542. (As will be described in more detail below, global array ground signal 560 is an alternative low voltage "ground" signal which differs from ground 550.) In this manner, 64 bits (one bit in each sub I/O block) may be read simultaneously from a single sector, according to an embodiment of the present invention.

Referring again to FIGS. 2C and 2D, it is also necessary to "ground" a bit line, for example bit line 220, to write/program the contents of a memory cell. More specifically, a bit line is selectively connected to a ground signal through a series of switching devices (not shown). It is appreciated that a wide variety of configurations of selection logic is well suited to embodiments of the present invention.

To program flash cells in a sector, one of the "SP" signals (SPVB(O), SPVB(1), SPVB(2), SPVB(3), SPVBA, SPVBB, SPVBRED and SPVBREDE) as shown in FIG. 5 is made active, which couples a bit line (selected via other selection logic, not shown) in each similarly numbered sub I/O to ground 550. For example, activating SPVB(3) 524 couples all word 3 sub I/Os to ground 550. Further, the PGMDB 555 signal is made inactive, in order not to couple global array ground signal 560 to ground 550. In this manner, 16 bits (one bit in each I/O block) may be programmed simultaneously in a single sector, according to an embodiment of the present invention.

If more than one bit within an I/O block is programmed, the programming of cells, particularly nearby cells, may potentially be disturbed. Greater currents flowing to ground for programming versus reading contribute to the aforementioned potential disturb events. Further, in general there are 15 cells separating a first cell from a second cell located in adjacent sub I/Os. For example, if the first cell is in the third location of word 0 sub I/O, then a second cell in the third location of word 1 sub I/O is separated by 16 cells (the last 13 cells in word 0 and the first two cells in word 1). Across 15 cells, which share a common word line, enough current may flow from the first cell through a common word line to the second cell to disturb programming of the second cell. Consequently, limiting a single "SP" line (520 through 532) to be active during programming operations separates cells being programmed by 63 intervening cells and serves to minimize the likelihood of disturb events, according to an embodiment of the present invention.

Figure 6:
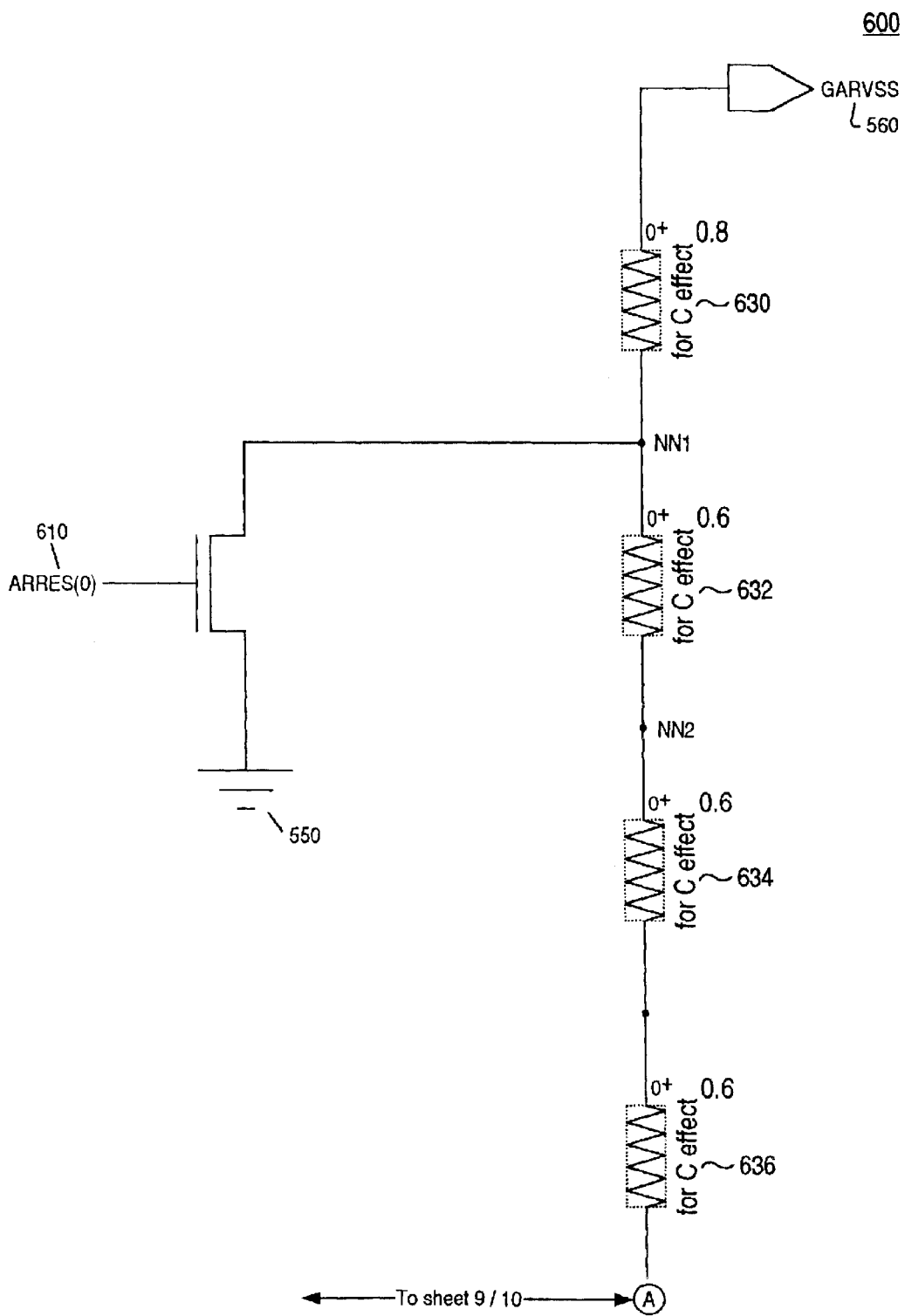
FIG. 6 illustrates a circuit for applying a bias voltage to a ground reference, according to an embodiment of the present invention.
Figure 6:
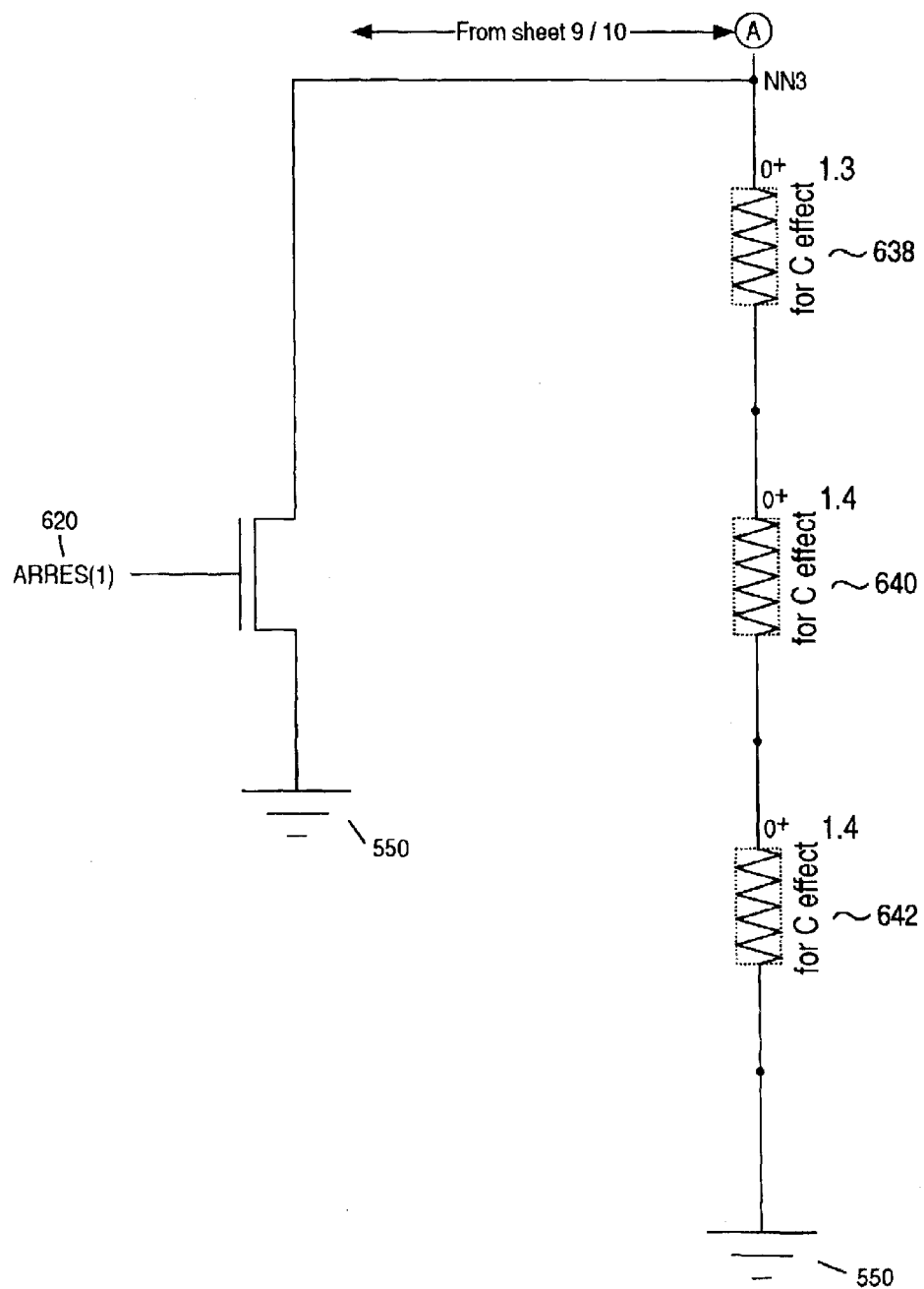

FIG. 6 illustrates a circuit 600 for applying a bias voltage to a ground reference, according to an embodiment of the present invention. The signal GARVss 560, mentioned above, may serve an array of flash cells as a "biased" ground reference. It is to be appreciated that a sub I/O ground is generally not coupled to ground 550 and GARVss 560 at the same time. Rather, by appropriate control (e.g., an XOR relationship) of the PGMDB 555 signal and the "SP" signals 520 through 532, only one coupling to a ground signal occurs at a time. By the selective control of signal ARRES (0) 610 and ARRES(1) 620, GARVss 560 may be coupled to ground 550 by varying strings of resistors (semiconductor resistive devices) 630 through 642. More specifically, if ARRES(0) 610 is active, the associated pass device is closed, and GARVss 560 is coupled to ground 550 via resistive device 620. If ARRES(1) 620 is active, GARVss 560 is coupled to ground 550 via resistive devices 630, 632, 634 and 636. If ARRES(0) 610 and ARRES(1) 620 are inactive, then GARVss 560 is coupled to ground 550 via the entire string of resistive devices, 630 through 642. Circuit 600 enables the ground reference of cells to be adjusted between approximately positive 0.1 volts to 0.2 volts relative to ground 550. Such a biased "ground" reference may be used to fine tune currents and voltages applied to cells, particularly during programming and programming verification operations. Such optimizing allows for improved operating speeds and increased endurance and reliability of programmed information in cells. Circuit 600 enables such fine tuning without true voltage and/or current source circuitry, which generally requires much more semiconductor area to implement and consequently would add additional cost to the product design.

The preferred embodiment of the present invention ground structure for page read and page write for flash memory is thus described. While the present invention has been described in particular embodiments, it should be appreciated that the present invention should not be construed as limited by such embodiments, but rather construed according to the below claims.

What is claimed is:

1. A method of performing a page read from a sector of flash memory cells comprising:
    driving a word line to a read voltage;
    coupling one bit line in each sub I/O block to a ground reference; and
    reading a bit value from one cell in each sub I/O block simultaneously.

2. The method as described in claim 1 wherein said coupling comprises activating a plurality of control lines to control a plurality of pass devices to couple said one bit line in each sub I/O block to a ground reference.

3. The method as described in claim 2 wherein said ground reference is ground.

4. The method as described in claim 2 wherein said ground reference is a biased ground reference.

5. A method of performing a page write to a sector of flash memory cells comprising:
    driving a word line to a programming voltage;
    coupling one bit line in each I/O block to a ground reference; and
    programming a bit value to one cell in each I/O block simultaneously.

6. The method as described in claim 5 wherein said coupling comprises activating one control line to control a plurality of pass devices to couple said one bit line in each I/O block to a ground reference.

7. The method as described in claim 5 wherein said ground reference is ground.

8. The method as described in claim 5 wherein said ground reference is a biased ground reference.

* * * * *